(12) United States Patent
Tanielian et al.

(10) Patent No.: US 8,164,154 B1
(45) Date of Patent: Apr. 24, 2012

(54) LOW PROFILE SCHOTTKY BARRIER DIODE FOR SOLAR CELLS AND SOLAR PANELS AND METHOD OF FABRICATION THEREOF

(76) Inventors: Aram Tanielian, Torrance, CA (US); Garo Tanielian, Torrance, CA (US)

(*) Notice: Subject to any disclaimer, the term of this patent is extended or adjusted under 35 U.S.C. 154(b) by 0 days.

(21) Appl. No.: 12/972,072

(22) Filed: Dec. 17, 2010

(51) Int. Cl.
*H01L 31/00* (2006.01)

(52) U.S. Cl. ........ 257/452; 257/453; 257/454; 257/455; 257/456; 257/457; 257/483; 257/484; 257/476; 257/738

(58) Field of Classification Search .................. 257/484, 257/452, 476, 483, 738
See application file for complete search history.

(56) References Cited

U.S. PATENT DOCUMENTS

| | | |
|---|---|---|
| 4,250,520 A | 2/1981 | Denlinger |
| 4,309,714 A | 1/1982 | Slatter |
| 4,357,178 A | 11/1982 | Bergeron et al. |
| 4,736,271 A | 4/1988 | Mack et al. |
| 5,214,003 A | 5/1993 | Shimakura et al. |
| 5,917,228 A | 6/1999 | Matsuda et al. |
| 6,593,597 B2 | 7/2003 | Sheu |
| 7,101,739 B2 | 9/2006 | Lanois |
| 7,129,558 B2 | 10/2006 | Skocki |
| 2004/0084770 A1 | 5/2004 | Skocki |
| 2007/0034984 A1 | 2/2007 | Skocki |
| 2007/0096316 A1 | 5/2007 | Schofield et al. |
| 2010/0102419 A1 | 4/2010 | Pan |
| 2010/0105194 A1 | 4/2010 | Pan |

*Primary Examiner* — Samuel Gebremariam
(74) *Attorney, Agent, or Firm* — Trojan Law Offices

(57) ABSTRACT

A low profile high power Schottky barrier bypass diode for solar cells and panels with the cathode and anode electrodes on the same side of the diode and a method of fabrication thereof are disclosed for generating a thin chip with both electrodes being on the same side of the chip. In an embodiment, a mesa isolation with a Zener diode over the annular region surrounding the central region of the mesa anode in the Epi of the substrate is formed. In an embodiment, a P-type Boron dopant layer is ion implanted in the annular region for the Zener Diode. This controls recovery from high voltage spikes from the diode rated voltage. A Schottky barrier contact for the anode and a contact for the cathode are simultaneously created on the same side of the chip.

6 Claims, 2 Drawing Sheets

LOW PROFILE SCHOTTKY BARRIER DIODE FOR SOLAR CELLS AND SOLAR PANELS AND METHOD OF FABRICATION THEREOF

FIELD OF THE INVENTION

The invention herein relates to semiconductor devices and methods relating thereto, and more particularly relates to improvement in Schottky diode devices.

BACKGROUND OF THE INVENTION

In the implementation of solar panels, it is desirable to use high power low $V_f$ bypass Schottky diode for a multi-junction solar cell, silicon solar cell and thin film solar panels to prevent the solar cell from degrading due to hot spot. Such degrading occurs in a typical Schottky diode in the art, which has an anode on the top of the diode and a cathode at the bottom of the diode. In the structure of the typical Schottky diode, current flows from the top to the bottom vertically and the flow path is long due to the thicknesses of an epitaxial layer (Epi) and of a substrate and resistance of the substrate. Also, the diode will be thick when sandwiched between electrodes in a panel, which in turn will make the panel thicker than desired. A desired way is to make the panel as thin as possible in order to save costs and to achieve efficiency in performance.

OBJECTS OF THE INVENTION

It is therefore an object of the invention to provide an improved Schottky barrier diode.

It is still another object of the invention to provide a low profile, thin Schottky barrier diode.

It is still further object of the invention to improve the reverse voltage breakdown to make it sharp in a typical Epi resistance and thickness at room and high temperatures.

It is yet another object of the invention to provide a tighter manufacturing tolerance for the series resistance of a Schottky barrier diode.

It is yet a further object of the invention to provide a Schottky barrier diode with a reduced parasitic action.

It is still a further object of the invention to provide a low resistance region self-aligned to a Schottky barrier diode.

It is yet a further object of the invention to provide an improved Schottky barrier mesa Zener diode.

It is yet a further object of the invention to eliminate the packaging of a high power Schottky barrier diode in the implementation of the bypass diode in a solar panel, which reduces the cost of labor due to ease of assembly and eliminates a package cost.

SUMMARY OF THE INVENTION

These and other objects, features and advantages of the invention are accomplished by the low profile Schottky barrier diode disclosed herein. To provide a low profile, thin Schottky diode, a Schottky diode of the present invention is constructed to have both an anode and a cathode on the same side of the diode, in which current direction is sideways in a very narrow gap of 3 to 6 microns between the anode and the cathode. In an embodiment of the present invention, a mesa-isolated Schottky barrier diode with a Zener structure formed on top of a very highly concentrated N++ substrate that has a resistivity of approximately 0.0001 ohm cm, and a fabrication method thereof are disclosed for generating a thin device having an anode and a cathode located on the same side of a chip. An epitaxial layer (Epi) lightly doped with an N-type dopant is located on a first surface of the substrate. A mesa is formed through the epitaxial layer on top of the substrate, and a Zener diode is formed in an annular region surrounding the mesa by P-type diffusion or implantation. The Epi thickness and concentration determine the Zener voltage breakdown. This Zener diode causes very low reverse voltage leakage and protects the Schottky barrier diode from high voltage spikes. A Schottky barrier contact is formed on the mesa and an ohmic contact is formed in a region outside the mesa on the first surface of the substrate. An anode electrode is connected to the Schottky barrier contact and a cathode electrode is connected to the ohmic contact. The Schottky barrier contact and the ohmic contact are formed by depositing a metal simultaneously in openings formed through an oxide layer that is grown on the surface of the mesa and on the remaining first surface of the substrate, in order to make a low series resistance connection to the Schottky barrier diode.

In another embodiment of the present invention, a substrate is highly doped with a P-type dopant, an epitaxial layer is lightly doped with the P-type dopant, and a Zener diode is formed in an annular region surrounding the mesa epitaxial layer by N-type diffusion or implantation.

The resulting low profile Schottky barrier diode may be less than or equal to 1 mm in thickness with low leakage voltage breakdown at temperatures as high as 150° C. In particular, the Schottky barrier diode may have a thickness of 0.3 to 1 mm. Also, the substrate is extremely low in resistance by a factor of ten (10), which makes the forward voltage very low compared to the existing diode in commercial production. The mesa structure with an annular Zener diode at the periphery of the mesa gives a very sharp Zener breakdown, which will protect the Schottky barrier diode from being destroyed from voltage spike in the back bias mode in solar cells and panels.

BRIEF DESCRIPTION OF THE DRAWINGS

These and other objects, features and advantages of the invention will be more fully appreciated with reference to the accompanying figures.

DETAILED DESCRIPTION OF THE INVENTION

A mesa-isolated low profile Schottky barrier diode with an annular Zener diode with planar electrodes located on the same side of the diode and a method of fabrication thereof are disclosed for generating a low profile bypass diode device having a rugged structure.

Figure 5:
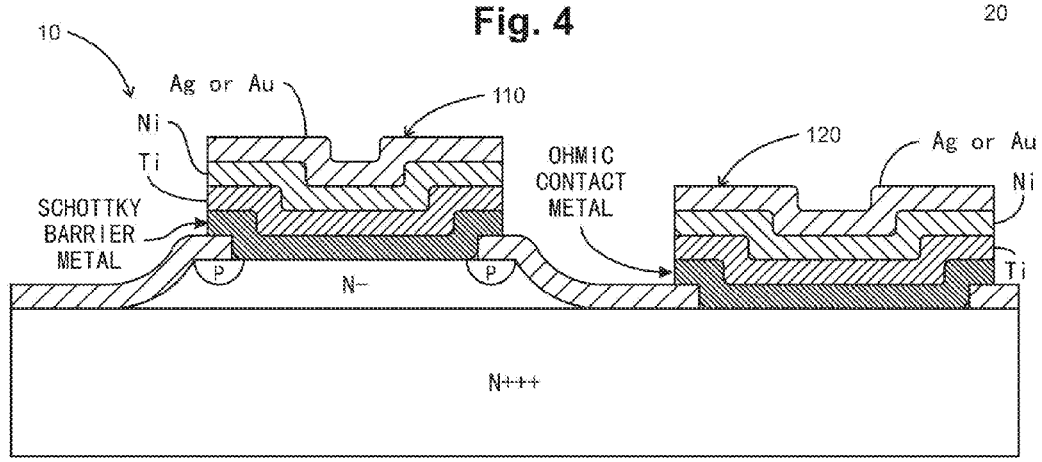
FIG. 5 shows the completion of the embodiment of the Schottky barrier diode with the deposition of a metal layer for the anode and the cathode.

FIG. 5 shows an embodiment of a Schottky barrier diode of the present invention. The Schottky barrier diode 10 comprises a substrate 20, a mesa 30 that is an epitaxial layer formed on the substrate 20, a Schottky barrier contact 90, an ohmic contact 100, an anode electrode 110, and a cathode electrode 120. The substrate 20 includes a first surface 22 and a second surface 24. The second surface 24 of the substrate is opposite to the first surface 22. The mesa 30 is located on a first portion of the first surface 22 of the substrate 20. The Schottky barrier contact 90 is formed on the mesa 30, and the ohmic contact 100 is formed on a second portion of the first surface 22 of the substrate 20. The second portion of the first surface 22 of the substrate 20 is located outside the mesa 30. The anode electrode 110 is connected to the Schottky barrier contact 90, and the cathode electrode 120 is connected to the ohmic contact 100, such that both the anode electrode 110 and the cathode electrode 120 are located on the same side of the Schottky barrier diode 10. The substrate 20 has a resistivity of approximately 0.0001 ohm cm and the epitaxial layer has a resistivity of approximately 1 ohm cm. The mesa 30 is approximately 70,000 Å to approximately 90,000 Å in thickness. The Schottky barrier contact 90 is a metal of thickness of approximately 2,000 Å and is made of a material selected from the group consisting of Chromium, Nickel-Chromium, Molybdenum, Tungsten, Palladium, and Platinum. Also, the ohmic contact 100 is a metal of thickness of approximately 2,000 Å and is made of a material selected from the group consisting of Chromium, Nickel-Chromium, Molybdenum, Tungsten, Palladium, and Platinum. Table 1 shows these various metals used as Schottky barriers that provide different performances for different applications of the Schottky barrier diode.

TABLE 1

| Barrier Metal | Energy Gap (Ev) | Practical Operating Temperature Limit |
|---|---|---|
| Chromium | 0.61 | 80° C. |
| Nickel-Chromium | 0.64 | 100° C. |
| Molybdenum | 0.68 | 125° C. |
| Tungsten | 0.67 | 125° C. |
| Palladium | 0.81 | 150° C. |
| Platinum | 0.90 | 165° C. |

Each of the anode electrode 110 and the cathode electrode 120 may include a Titanium layer, a Nickel layer, and a Silver layer as illustrated in FIG. 5. In an embodiment, the Titanium layer is 1,000 Å, the Nickel layer is 2,000 Å, and the Silver layer is 25,000 Å in thickness. In another embodiment, each of the anode electrode 110 and the cathode electrode 120 may include a Titanium layer, a Nickel layer, and a Gold layer. In still another embodiment, the Titanium layer is 1,000 Å, the Nickel layer is 2,000 Å, and the Gold layer is 25,000 Å in thickness. The distance or gap between the anode and the cathode of the Schottky barrier diode 10 is approximately 3 to approximately 6 microns.

The Schottky barrier diode 10 may further comprise an oxide layer 40 that is disposed on peripheral regions of the mesa 30 and of the second portion of the first surface 22 of the substrate 20 such that the oxide layer 40 is in contact with a periphery of the Schottky barrier contact 90 and with a periphery of the ohmic contact 100.

The Schottky barrier diode 10 may further comprise a guard ring 50 that is formed in the mesa epitaxial layer 30 around a periphery of the mesa 30 to form a Zener diode such that the Schottky barrier contact 90 is in contact with the Zener diode. The substrate 20 and the epitaxial layer of the Schottky barrier diode 10 have a first conductivity type and the guard ring 50 has a second conductivity type. The substrate 20 is highly doped with a first conductivity-type dopant, the epitaxial layer is lightly doped with the first conductivity-type dopant, and the guard ring 50 is formed with a second conductivity-type dopant. The guard ring 50 has a substantially Gaussian distribution of a concentration of the second conductivity-type dopant with respect to a depth in the mesa epitaxial layer 30. The concentration of the second conductivity-type dopant at a depth of approximately 0.3 microns below a top surface of the mesa epitaxial layer 30 is higher by 2.5 orders of magnitude than the concentration of the second conductivity-type dopant at the top surface of the mesa epitaxial layer 30.

In the embodiment of the Schottky barrier diode shown in FIG. 5, the first conductivity-type dopant is an N-type dopant and the second conductivity-type dopant is a P-type dopant. In an alternative embodiment, the first conductivity-type dopant may be a P-type dopant and the second conductivity-type dopant may be an N-type dopant. An example of the N-type dopant is phosphorus, and an example of the P-type dopant is boron.

The Schottky barrier diode 10 may be less than or equal to 1 mm in thickness with low leakage voltage breakdown of approximately 50 microamps at the reverse breakdown at temperatures as high as 150° C. In particular, the Schottky barrier diode may have a thickness of 0.3 to 1 mm. Also, the substrate is extremely low in resistance by a factor of ten (10), which makes the forward voltage very low compared to the axial Schottky barrier diode existing in the art. Whereas the forward voltage in the prior art Schottky barrier diode is usually 0.8 to 0.97 volts, the forward voltage at 8 amp in the Schottky barrier diode of the present invention is approximately 0.35 to approximately 0.4 volts for the same comparable area. The mesa structure with the annular Zener diode at the periphery of the mesa gives a very sharp Zener breakdown, which will protect the Schottky barrier diode from being destroyed from voltage spike in the back bias mode in solar cells and panels.

The Epi thickness and concentration determine the Zener voltage breakdown. The following formula may be used for finding voltage breakdown, Epi thickness or Epi resistivity for bulk breakdown:

$$W = 0.505\sqrt{\rho V}$$

Where:
  W = Epi thickness in micron
  ρ = Resistivity of Epi
  V = Breakdown voltage
As an example, if the resistivity of Epi (ρ) is 1 ohm cm and the Epi thickness (W) is 5 micron:

$$5 = 0.505(\rho V)^{1/2}$$

$$25 = (0.255)V$$

$$V = 25/0.255 = 98V$$

Since the anode and cathode metal contacts of the Schottky barrier diode of the present invention are on the electrical contacts directly and the junction is very close to the heat sink, the Schottky barrier diode of the present invention has a very low thermal resistance of approximately 0.1° C. per Watt, whereas the thermal resistance of the prior art Schottky barrier diode is typically 0.5 to 1.5° C. per Watt. The Schottky barrier diode of the present invention is fully passivated and no packaging is required. The cost for manufacturing the Schottky barrier diode of the present invention is low due to no need for package.

Figure 1:
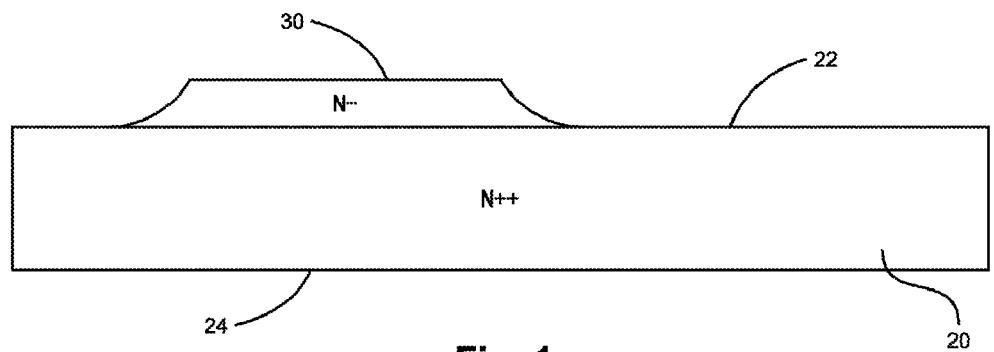
FIG. 1 is a cross-sectional view of a first stage in the fabrication of an embodiment of a Schottky barrier diode of the present invention, where a mesa is formed by etching into an N-type epitaxial layer for the anode of the diode on a silicon semiconductor substrate.
Figure 2:
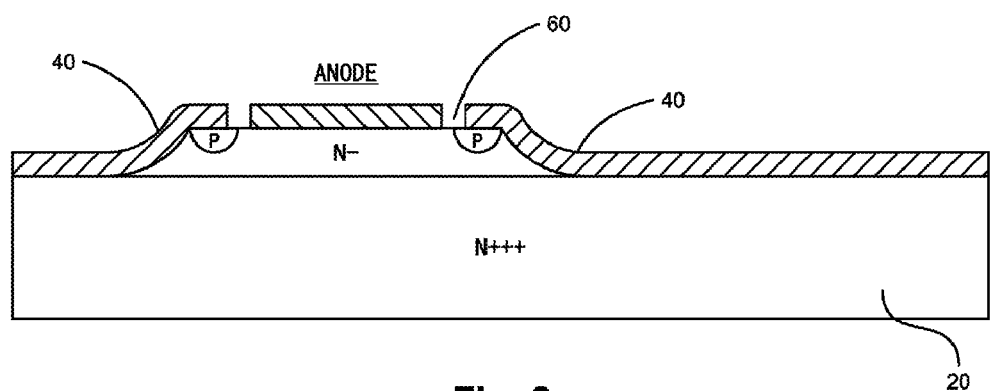
FIG. 2 is a cross-sectional view of a later stage in the fabrication of the embodiment of the Schottky barrier diode, where an oxide layer is grown on the surface of the mesa and on the surface of the substrate and an annular opening is formed through the oxide layer around a top periphery of the mesa for P-type Implant or diffusion to form a Zener diode.

FIGS. 1 through 5 illustrate a method for forming the Schottky barrier diode 10. The mesa 30 is formed by etching through the epitaxial layer (Epi) that is located on the first surface 22 of the substrate 20, such that the mesa 30 is located on a first portion of the first surface 22 of the substrate 20. This mesa formation in the Epi has the effect of minimizing the parasitic action of the Schottky barrier diode. The substrate 20 is highly doped with a first conductivity-type dopant and the epitaxial layer is lightly doped with the first conductivity-type dopant. As discussed above, in the embodiment shown in FIG. 1, the first conductivity-type dopant is an N-type dopant, an example of which is phosphorus. In an alternative embodiment, the first conductivity-type dopant is a P-type dopant, an example of which is boron. In the embodiment illustrated in FIG. 1, an N++ extremely high concentration of phosphorus having resistivity of 0.0001 ohm cm <111> silicon substrate with an n-epitaxial silicon having resistivity of 1 ohm cm is provided. The mesa 30 having a thickness of 70,000 Å to 90,000 Å is isolated on the substrate 20 by etching. The oxide layer 40 is grown on the surface of the mesa 30 and on the remaining first surface of the substrate 20. As illustrated in FIG. 2, an annular opening 60 is formed through the oxide layer 40 around a top periphery of the mesa 30. At this stage illustrated in FIG. 2, the thickness of the oxide layer 40 grown on the surface of the mesa 30 is approximately 4,000 Å. The guard ring 50 is formed in the mesa 30 by ion-implanting or diffusing a second conductivity-type dopant through the opening 60 of the oxide layer 40 and into the mesa 30 to provide a Zener diode. The guard ring 50 has a substantially Gaussian distribution of a concentration of the second conductivity-type dopant with respect to a depth in the mesa epitaxial layer 30. This will form the parallel connection of the Zener diode to the Schottky barrier diode after the barrier metal contact is deposited. The concentration of the second conductivity-type dopant at a depth of approximately 0.3 microns below a top surface of the mesa epitaxial layer 30 is higher by 2.5 orders of magnitude than the concentration of the second conductivity-type dopant at the top surface of the mesa epitaxial layer 30. In the embodiment illustrated in FIG. 2, the second conductivity-type dopant is a P-type dopant, which is ion implanted or diffused through the opening 60 of the oxide layer 40. In an alternative embodiment, the second conductivity-type dopant is an N-type dopant where the substrate 20 and the epitaxial layer are doped with a P-type dopant.

Figure 3:
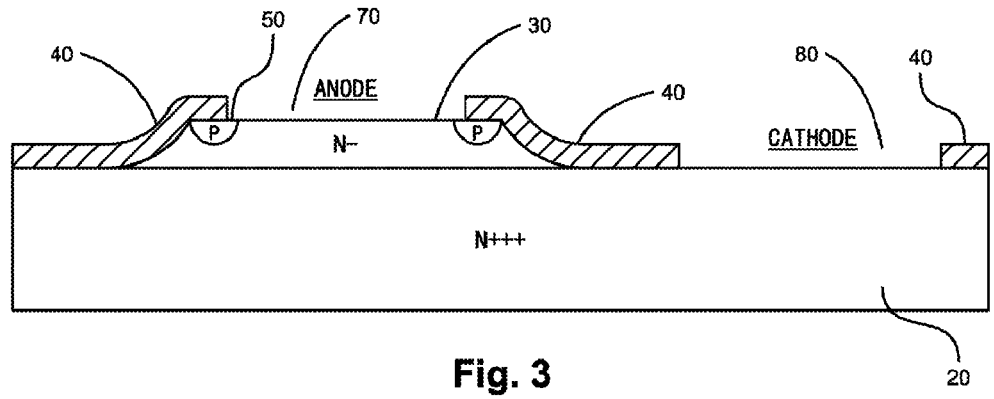
FIG. 3 is a cross-sectional view of a later stage in the fabrication of the embodiment of the Schottky barrier diode, where a P-type annular ring has been ion implanted or diffused into the mesa Epi through the annular opening, and a second opening and a third opening are formed through the oxide layer in an anode region and a cathode region respectively.

As illustrated in FIG. 3, a second opening 70 and a third opening 80 are formed through the oxide layer 40 for the formation of the Schottky barrier contact and for the formation of the ohmic contact respectively. The second opening 70 is over a top surface of the mesa 30, and the third opening 80 is over the second portion of the first surface 22 of the substrate 20, where the second portion of the first surface 22 of the substrate 20 is located outside the mesa 30. At this stage illustrated in FIG. 3, the thickness of the oxide layer 40 grown on the surface of the mesa 30 is approximately 6,000 Å.

Figure 4:
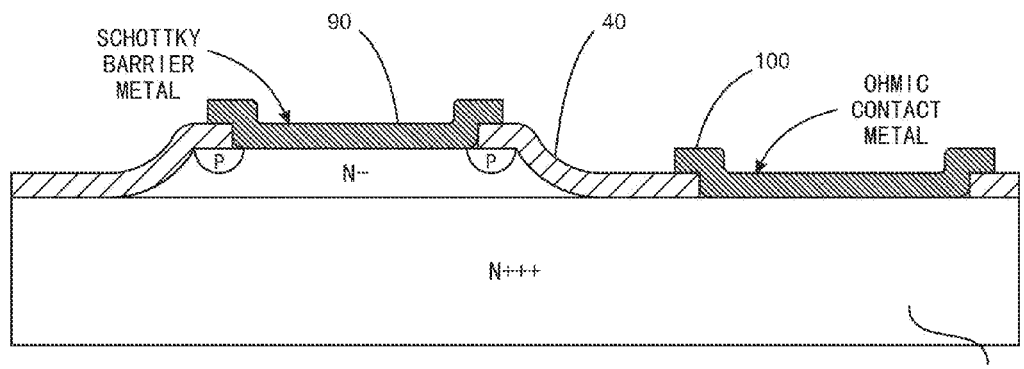
FIG. 4 is a cross-sectional view of a later stage in the fabrication of the embodiment of the Schottky barrier diode, where a metal is simultaneously deposited through the second opening and the third opening of the oxide layer to form a Schottky barrier contact with the annular Zener diode at the mesa and a cathode ohmic contact at the N+++ substrate.

As illustrated in FIG. 4, a Schottky barrier contact 90 is formed on the mesa 30 by depositing a metal in the second opening 70 of the oxide layer 40, creating a rectifying junction. Simultaneously, an ohmic contact 100 is formed on the second portion of the first surface 22 of the substrate 20 by depositing a metal in the third opening 80 of the oxide layer 40, creating a rectifying junction with the semiconductor substrate. The metal for forming the Schottky barrier contact 90 and for forming the ohmic contact 100 may be selected from Chromium, Nickel-Chromium, Molybdenum, Tungsten, Palladium, and Platinum, depending on a barrier height to be implemented. The higher the barrier height is the better the performance of the Schottky barrier diode is at higher temperature due to low reverse leakage. As shown in Table 1 above, these metals provide different performances for different applications of the Schottky barrier diode. The metal is deposited simultaneously in the second opening 70 and in the third opening 80 of the oxide layer 40 to form the Schottky barrier contact 90 and the ohmic contact 100, each of which is a metal of thickness of approximately 2,000 Å. FIG. 4 illustrates the Schottky barrier with the annular Zener diode at the mesa 30 and the ohmic contact on the substrate 20, which are formed as a result of the simultaneous deposition of the metal. As illustrated in FIG. 4, the Schottky barrier contact 90 is in contact with the annular Zener diode region and with the anode region simultaneously. The Schottky barrier creating a rectifying junction and the ohmic contact creating a rectifying junction with the substrate make a low series resistance connection to the mesa Schottky barrier diode.

As illustrated in FIG. 5, the anode electrode 110 is formed and connected to the Schottky barrier contact 90 by depositing a metal onto the Schottky barrier contact 90. Simultaneously, the cathode electrode 120 is formed and connected to the ohmic contact 100 by depositing a metal onto the ohmic contact 100. The metal for forming the anode electrode 110 and for forming the cathode electrode 120 may comprise Titanium, Nickel, and Silver, as illustrated in FIG. 5. In an embodiment, the metal may comprise a Titanium layer having a thickness of 1,000 Å, a Nickel layer having a thickness of 2,000 Å, and a Silver layer having a thickness of 25,000 Å. In another embodiment, the metal for forming the anode electrode 110 and for forming the cathode electrode 120 may comprise Titanium, Nickel, and Gold. In still another embodiment, the metal may comprise a Titanium layer having a thickness of 1,000 Å, a Nickel layer having a thickness of 2,000 Å, and a Gold layer having a thickness of 25,000 Å. FIG. 5 illustrates the anode electrode 110 and the cathode electrode 120 formed as a result of the simultaneous deposition of the metal, such that both the anode electrode and the cathode electrode are located on the same side of the Schottky barrier diode 10.

Figure 6:
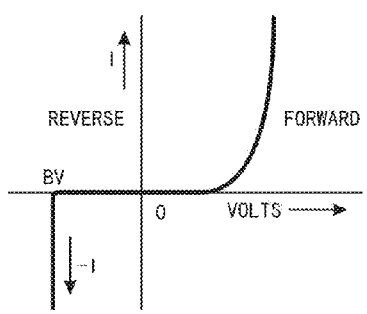
FIG. 6 is a graph of the current (I) versus voltage characteristics for the forward and the reverse operation of the Schottky barrier diode with Zener breakdown, where BV means Breakdown Voltage.

The resulting device according to the present invention achieves a rugged and lower series resistance low profile and low resistance planar Schottky barrier bypass diode. Also, the ion implantation or diffusion of the second conductivity-type dopant (P-type dopant in the embodiment illustrated in FIG. 5) is used to form a Schottky barrier with a Zener diode for high voltage spike protection with low reverse voltage leakage. FIG. 6 shows a general graph of the current (I) versus voltage characteristics for the forward and reverse operation of the Schottky barrier bypass diode with Zener breakdown. In addition to the forward bias diode characteristics of the Schottky barrier bypass diode shown in FIG. 6, improved reverse breakdown characteristics are also achieved with the Schottky barrier diode of the present invention. In particular, an adjustable Zener diode is formed by the structure where the concentration of the second conductivity-type dopant (P-type dopant in the embodiment illustrated in FIG. 5) at a depth of approximately 0.3 microns below a top surface of the epitaxial layer is higher by 2.5 orders of magnitude than the concentration of the second conductivity-type dopant at the top surface of the epitaxial layer. In this situation, the spreading of the depletion layer surrounding the junction of the Schottky barrier bypass diode is presented by the ion-implanted or diffused region, thereby increasing the peak electric field for a given voltage. As a result, the diode approaches the avalanche breakdown at a lower voltage than would otherwise be the case. Thus, a proper selection of the implant energy and/or of the diffusion depth locating the peak of the Gaussian distribution for the implanted region determines the resulting reverse biased avalanche breakdown voltage for the Zener diode. Accordingly, by adjusting the implant energy and/or diffusion region, and/or by adjusting the dose or concentration of the second conductivity-type dopant (P-type dopant in the embodiment illustrated in FIG. 5) in the implanted or diffused region, the Zener breakdown voltage for the resulting Schottky barrier bypass diode can be controlled. A Schottky barrier diode of any current size from low current up to 100 Amps can be designed in accordance with the present invention.

While the said detailed description elaborates workable embodiments of the present invention, the said embodiments shall not be construed as a limitation on the patented scope and claims of the present invention and, furthermore, all equivalent adaptations and modifications based on the technological spirit of the present invention shall remain protected within the scope and claims of the invention herein.

What is claimed is:

1. A Schottky barrier diode comprising:
   a substrate including a first surface and a second surface, the second surface opposite to the first surface;
   a mesa that is an epitaxial layer formed on a first portion of the first surface of the substrate;
   a Schottky barrier contact formed on the mesa;
   an ohmic contact formed on a second portion of the first surface of the substrate, the second portion of the first surface of the substrate located outside the mesa;
   an anode electrode connected to the Schottky barrier contact;
   a cathode electrode connected to the ohmic contact, such that both the anode electrode and the cathode electrode are located on the same side of the Schottky barrier diode;
   an oxide layer disposed on peripheral regions of the mesa and of the second portion of the first surface such that the oxide layer is in contact with a periphery of the Schottky barrier contact and with a periphery of the ohmic contact; and
   a guard ring, the guard ring formed in the epitaxial layer around a periphery of the mesa to form a Zener diode such that the Schottky barrier contact is in contact with the Zener diode;
   wherein the Schottky barrier diode is 0.3 to 1 mm in thickness.

2. The Schottky barrier diode of claim 1, wherein the substrate is highly doped with a first conductivity-type dopant, the epitaxial layer is lightly doped with the first conductivity-type dopant, and the guard ring is formed with a second conductivity-type dopant.

3. The Schottky barrier diode of claim 2, wherein the guard ring has a substantially Gaussian distribution of a concentration of the second conductivity-type dopant with respect to a depth in the epitaxial layer.

4. The Schottky barrier diode of claim 2, wherein a concentration of the second conductivity-type dopant at a depth of approximately 0.3 microns below a top surface of the epitaxial layer is higher by 2.5 orders of magnitude than a concentration of the second conductivity-type dopant at the top surface of the epitaxial layer.

5. The Schottky barrier diode of claim 2, wherein the first conductivity-type dopant is an N-type dopant and the second conductivity-type dopant is a P-type dopant.

6. The Schottky barrier diode of claim 2, wherein the first conductivity-type dopant is a P-type dopant and the second conductivity-type dopant is an N-type dopant.

* * * * *